United States Patent
Li

(10) Patent No.: US 10,345,667 B1
(45) Date of Patent: Jul. 9, 2019

(54) DISPLAY PANEL AND DISPLAY DEVICE

(71) Applicant: Shenzhen China Star Optoelectronics Semiconductor Display Technology Co., Ltd., Shenzhen (CN)

(72) Inventor: Wenying Li, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/748,660

(22) PCT Filed: Jan. 12, 2018

(86) PCT No.: PCT/CN2018/072465
§ 371 (c)(1),
(2) Date: Jan. 30, 2018

(30) Foreign Application Priority Data

Dec. 29, 2017 (CN) .......................... 2017 1 1478489

(51) Int. Cl.
| | |
|---|---|
| H01L 29/04 | (2006.01) |
| H01L 31/036 | (2006.01) |
| G02F 1/1362 | (2006.01) |
| G02F 1/1368 | (2006.01) |
| H01L 27/12 | (2006.01) |
| G02F 1/1335 | (2006.01) |

(52) U.S. Cl.
CPC ...... *G02F 1/136286* (2013.01); *G02F 1/1368* (2013.01); *G02F 1/133514* (2013.01); *H01L 27/124* (2013.01); *G02F 2201/121* (2013.01); *G02F 2201/123* (2013.01)

(58) Field of Classification Search
CPC ............... H01L 27/24; G02F 1/136286; G02F 1/133514; G02F 1/1368
USPC ........................................................ 257/72
See application file for complete search history.

(56) References Cited

U.S. PATENT DOCUMENTS

2018/0012555 A1* 1/2018 Zhang ................. G09G 3/3659
2018/0314121 A1* 11/2018 Fang ................. G02F 1/136286
2019/0019815 A1* 1/2019 Wang ................. G02F 1/133512

* cited by examiner

*Primary Examiner* — David S Blum

(57) ABSTRACT

The present invention provides a display panel and display device. The display panel includes an array substrate and a color film substrate. The array substrate is provided with a plurality of data lines, a plurality of gate line sets arranged parallel to each other, and a plurality of first thin film transistors. Each set of the gate lines includes a first gate line and a second gate line. gate electrode of each of the first thin film transistors connected to the first gate line correspondingly, and source electrode of each of the first thin film transistors connected to the second gate line correspondingly, and drain electrode of each of the first thin film transistors connected to a first common electrode.

20 Claims, 6 Drawing Sheets

DISPLAY PANEL AND DISPLAY DEVICE

RELATED APPLICATIONS

This application is a National Phase of PCT Patent Application No. PCT/CN2018/072465 having International filing date of Jan. 12, 2018, which claims the benefit of priority of Chinese Patent Application No. 201711478489.3 filed on Dec. 29, 2017. The contents of the above applications are all incorporated by reference as if fully set forth herein in their entirety.

FIELD AND BACKGROUND OF THE INVENTION

The disclosure relates to the field of displaying techniques, and in particular to a display panel and a display device.

Due to development of liquid crystal display (LCD) technology, more and more users are using LCD devices. Size of LCD panels is getting larger and larger, and resolution of the LCD panels is also getting higher and higher. The LCD panels usually provide a turn-on voltage for a thin-film transistor (TFT) through a gate driver, and the LCD panels provide a data signal for the TFT through a source driver. When the TFT is under control of the gate driver and is turned on, at the same time, a source driver charges a sub-pixel.

Referring to FIG. 1, a relation view shows between a charging time and a resolution of a known pixel. As shown in FIG. 1, because resolution Res of the LCD panel is greatly increased, charging time of the pixel is shortened. For example, a panel with FHD resolution is driven at 120 HZ by a gate driver, at which time a gate line charges approximately 7.4 us. In addition, for a panel having 4K2K resolution, because the number of gate lines is increased from 1080 to 2160 and driven by the gate driver at 120 HZ, at which time the charging time of one gate line is reduced by about half to 3.7 us. If the RC load in the pixel cannot be made smaller, scanning speed of the gate line will be slower, which will affect display of the liquid crystal display panel.

Therefore, there is a need to provide a display panel and a display device, so as to overcome disadvantages in the prior art.

SUMMARY OF THE INVENTION

The object of the present invention to provide a display panel and a display device for improving the display performance of the display panel.

To overcome the above-mentioned disadvantages, the technical schemes provided by the present invention are hereunder illustrated.

The embodiment of the present invention provides a display panel and a color film substrate, wherein the array substrate is provided with a plurality of data lines, a plurality of gate line sets arranged in parallel to each other, a plurality of first thin film transistors, a plurality of second thin film transistors, a pixel electrode and a first common electrode, a second common electrode disposed on the color filter substrate, wherein the pixel electrode and the second common electrode form a liquid crystal capacitor;

each set of the gate line sets comprises a first gate line and a second gate line, wherein the first gate line and the second gate line are arranged in parallel to each other;

the second thin film transistors are disposed at intersecting points of the second gate lines and the data lines;

a gate electrode of each of the second thin film transistors are connected to the second gate line correspondingly, a source electrode of each of the second thin film transistors are connected to the data line correspondingly, and a drain electrode of each of the second thin film transistors are connected to the pixel electrode;

a gate electrode of each of the first thin film transistors are connected to the first gate line correspondingly, a source electrode of each of the first thin film transistors are connected to the second gate line correspondingly, and the first common electrode is connected to the drain electrode of each of the first thin film transistors; and the first thin film transistor is used to accelerate speed of turning off the second thin film transistor.

In the display panel according to one embodiment of the present invention, the display panel further comprises a gate driver, the gate driver is disposed on two sides of the display panel, wherein the sources of the first thin film transistor is connected to a middle section of the second gate line.

In the display panel according to one embodiment of the present invention, the display panel further comprises a gate driver, the gate driver is disposed only on one side of the display pane, and the source of the first thin film transistor is connected to a position of the second gate line away from a side of the gate driver.

In the display panel according to one embodiment of the present invention, each of the second gate lines corresponds to one of the first gate lines, and the number of the first thin film transistors connecting the first gate lines and the number of the second thin film transistors connecting the corresponding second gate lines between the ratio of 1/5 to 1/10.

In the display panel according to one embodiment of the present invention, the second gate line of an n-th gate line set inputs a turn-on signal of high voltage level, meanwhile, a signal is not input to the first gate line of the n-th gate line set, and the second thin film transistor is turned on, and the first thin film transistor is turned off. When the second gate line of the n-th gate line set inputs a turn-off signal of low voltage level, and at the same time, the turn-on signal of high voltage level is input to the first gate line of the n-th gate line set, and the second thin film transistor is turned off and the first thin film transistor is turned on, and, the number of the n-th is an integer.

In the display panel according to one embodiment of the present invention, the first common electrode voltage is less than or equal to the voltage of the first thin film transistor is turned off.

In the display panel according to one embodiment of the present invention, the display panel comprises "n" gate line sets, and the first gate line of an m-th gate line set connected to the second gate line of an (m+1)th gate line set, and the number of n and m is a positive integer, the n is greater than or equal to 2 and the m+1 is less than or equal to n.

In the display panel according to one embodiment of the present invention, the display panel comprises "n" gate line sets, and the first gate line of an m-th gate line set connected to the second gate line of an (m+k)th gate line set, and the number of n, m and k is a positive integer, the n is greater than or equal to 3, the k is greater than or equal to 2 and the m+k is less than or equal to n.

In the display panel according to one embodiment of the present invention, the n-th gate line set is not provided with the second gate line. Alternatively, the second gate line of the n-th gate line set is driven separately.

The embodiment of the present invention further provides a display device, which includes a display panel includes an array substrate and a color film substrate, wherein the array substrate is provided with a plurality of data lines, a plurality of gate line sets arranged in parallel to each other, a plurality of first thin film transistors, a plurality of second thin film transistors, a pixel electrode and a first common electrode, a second common electrode disposed on the color filter substrate, wherein the pixel electrode and the second common electrode form a liquid crystal capacitor;

each set of the gate line sets comprises a first gate line and a second gate line, wherein the first gate line and the second gate line are arranged in parallel to each other;

the second thin film transistors are disposed at intersecting points of the second gate lines and the data lines;

a gate electrode of each of the second thin film transistors are connected to the second gate line correspondingly, a source electrode of each of the second thin film transistors are connected to the data line correspondingly, and a drain electrode of each of the second thin film transistors are connected to the pixel electrode;

a gate electrode of each of the first thin film transistors are connected to the first gate line correspondingly, a source electrode of each of the first thin film transistors are connected to the second gate line correspondingly, and the first common electrode is connected to the drain electrode of each of the first thin film transistors; and the first thin film transistor is used to accelerate speed of turning off the second thin film transistor.

In the display device according to some embodiments of the present invention, the display panel further comprises a gate driver, the gate driver disposed on two sides of the display panel, wherein the sources of the first thin film transistor is connected to a middle section of the second gate line.

In the display device according to some embodiments of the present invention, the display panel further comprises a gate driver, the gate driver is disposed only on one side of the display pane, and the source of the first thin film transistor is connected to a position of the second gate line away from a side of the gate driver.

In the display device according to some embodiments of the present invention, each of the second gate lines corresponds to one of the first gate lines, and the number of the first thin film transistors connecting the first gate lines and the number of the second thin film transistors connecting the corresponding second gate lines between the ratio of 1/5 to 1/10.

In the display device according to some embodiments of the present invention, the second gate line of an i-th gate line set inputs a turn-on signal of high voltage level, and meanwhile, a signal is not input to the first gate line of the i-th gate line set, and the second thin film transistor is turned on, and the first thin film transistor is turned off. When the second gate line of the i-th gate line set inputs a turn-off signal of low voltage level, and at the same time, the turn-on signal of high voltage level is input to the first gate line of the i-th gate line set, and the second thin film transistor is turned off and the first thin film transistor is turned on, and, the number of the i-th is an integer.

In the display device according to some embodiments of the present invention, the first common electrode voltage is less than or equal to the voltage of the first thin film transistor is turned off.

In the display device according to some embodiments of the present invention, the display panel comprises "n" gate line sets, and the first gate line of an m-th gate line set connected to the second gate line of an (m+1)th gate line set, and the number of n and m is a positive integer, the n is greater than or equal to 2 and the m+1 is less than or equal to n.

In the display device according to some embodiments of the present invention, the display panel comprises "n" gate line sets, and the first gate line of an m-th gate line set connected to the second gate line of an (m+k)th gate line set, and the number of n, m and k is a positive integer, the n is greater than or equal to 3, the k is greater than or equal to 2 and the m+k is less than or equal to n.

In the display device according to some embodiments of the present invention, the n-th gate line set is not provided with the second gate line. Alternatively, the second gate line of the n-th gate line set is driven separately.

In comparison to the existing display panel, by the plurality of first thin film transistors and the plurality of first gate lines are configured, so as to assist the display panel to perform charging and signal releasing operations. Therefore, the display panel and the display device of the present invention can improve the display performance of the display panel.

DESCRIPTION OF THE SEVERAL VIEWS OF THE DRAWINGS

The above objectives, and other objectives, features, advantages, and embodiments of the present invention will be better understood from the following description being considered in connection with the accompanied drawings, and in which a preferred embodiment of the invention is illustrated by way of example.

DESCRIPTION OF SPECIFIC EMBODIMENTS OF THE INVENTION

Figure 1:
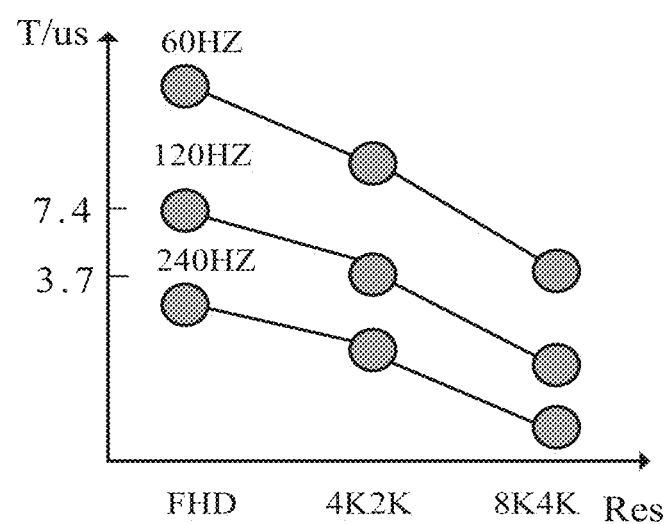
FIG. 1 is a relation view showing between a charging time and a resolution of a known pixel.

In order to more clearly describe the embodiments of this disclosure or the conventional technical solutions, the description is used to make a simple introduction of the drawings used in the following embodiments. The following description of the drawings are merely some embodiments of this disclosure, and the direction terms mentioned in the present invention, such as "upper", "lower", "front", "rear", "left", "right", "top", "bottom", etc., are only with reference to the attached figures and by to illustrate the invention and not to limit the invention.

Throughout this specification and in the drawings like parts will be referred to by the same reference numerals.

The present invention will now be more specifically described with reference to the following examples. It is to be noted that the following description, in combination with particular features, structures, or characteristics, is given below for illustration and description purposes only. This is not exhaustive nor does it limit the exact form disclosed. All other embodiments obtained by persons of ordinary skill in the art based on the embodiments of the present invention or in combination with other embodiments without making any creative efforts shall fall within the protection scope of the present invention.

The embodiment of the present invention further provides a display device, which includes a display panel includes an array substrate and a color film substrate, wherein the array substrate is provided with a plurality of data lines, a plurality of gate line sets arranged in parallel to each other, a plurality of first thin film transistors, a plurality of second thin film transistors, a pixel electrode and a first common electrode, a second common electrode disposed on the color filter substrate, wherein the pixel electrode and the second common electrode form a liquid crystal capacitor.

Figure 2:
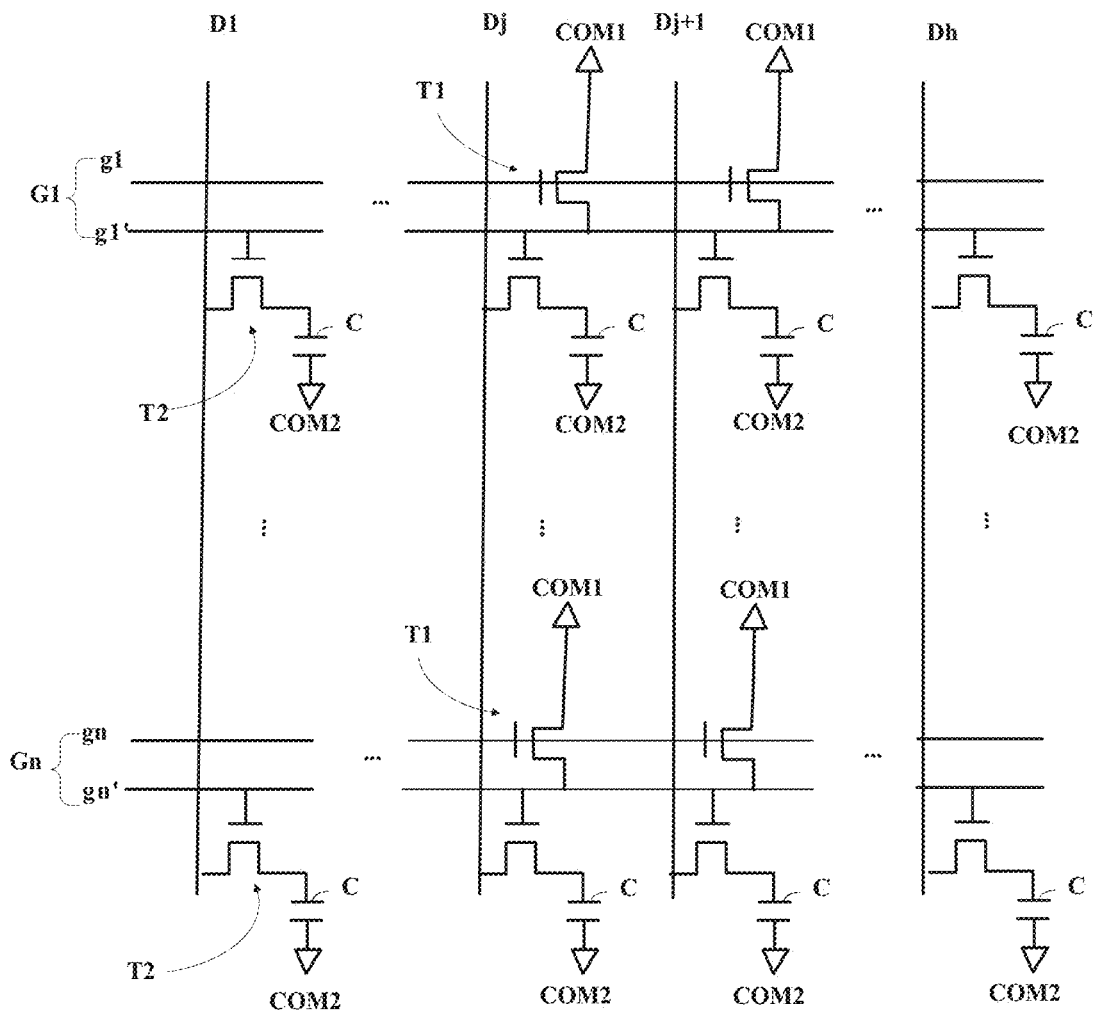
FIG. 2 is a schematic view of a structure of a display panel according to a preferred embodiment of the present invention.

Referring to FIG. 2 is a schematic view of a structure of a display panel according to a preferred embodiment of the present invention is shown. As shown in FIG. 2, the preferred embodiment provides a display panel includes a plurality of data lines such as data lines D1 to Dh, a plurality of the gate line sets are arranged in parallel to each other, such as gate line groups G1 to Gn, a plurality of the first thin film transistors T1, a plurality of the second thin film transistors T2, the pixel electrode and the first common electrode COM1. The second common electrode COM2 is disposed on the color filter substrate, and a liquid crystal capacitor C is formed by the pixel electrode and the second common electrode COM2.

As described above, in the present embodiment, each set of the gate line sets includes a first gate line and a second gate line. As shown in FIG. 2, for example, the gate line set G1 includes a first gate line g1 and a second gate line g1', and the first gate line g1 and the second gate line g1' are arranged in parallel to each other. In another example, the gate line group Gn includes the first gate line gn and the second gate line gn', and the first gate line gn and the second gate line gn' are arranged in parallel to each other.

As described above, in the present embodiment, the second thin film transistors are disposed at intersecting points of the second gate lines and the data lines. As shown in FIG. 2, specifically, the second thin film transistor T2 connected to the intersection of the data line D1 and any one of the second gate lines g1'-gn', and the second thin film transistor T2 connected to the intersection of the data line Dj and any one of the second gate lines g1'-gn Thin film transistor T2. With this column push, therefore, the second thin film transistor T2 connected to the intersection of each of the data lines and each of the second gate lines. In summary, the plurality of second thin film transistors T2 are arranged in a matrix form.

As described above, in the present embodiment, a gate electrode of each of the second thin film transistors T2 connected to the second gate line correspondingly, a source electrode of each of the second thin film transistors connected to the data line correspondingly, and a drain electrode of each of the second thin film transistors connected to the pixel electrode. In particular, when the plurality of second thin film transistors T2 are arranged in a matrix form, the gate electrode of the second thin film transistor T2 in a first column of a first row connected to the second gate line g1', the drain electrode of the second thin film transistor T2 passes through the liquid crystal capacitor C is connected to the second common electrode COM2, and the source electrode of the second thin film transistor T2 connected to the data line D1. As shown in FIG. 2.

As described above, in the present embodiment, a gate electrode of each of the first thin film transistors T1 connected to the first gate line correspondingly, a source electrode of each of the first thin film transistors T1 connected to the second gate line correspondingly, and the first common electrode COM1 is connected to the drain electrode of each of the first thin film transistors T1. For example, the gate electrode of each of the first thin film transistors T1 connected to the first gate line g1, the drain electrode of each of the first thin film transistors T1 connected to the first common electrode COM1, and the source electrode of each of the first thin film transistors T1 connected to the second gate line g1'. In some embodiments, when the number of the first thin film transistors T1 smaller than the number of the second thin film transistors T2, and the first common electrode COM1 voltage is less than or equal to the voltage of the first thin film transistor T1 is turned off. As shown in FIG. 2.

As described above, in the present embodiment, the display panel further includes a gate driver for transmitting a scan signal. As shown in FIG. 3 to FIG. 6, specifically, the second gate line of an i-th gate line set inputs a turn-on signal of high voltage level, meanwhile, a signal is not input to the first gate line of the i-th gate line set, and the second thin film transistor is turned on, and the first thin film transistor is turned off. When the second gate line of the i-th gate line set inputs a turn-off signal of low voltage level, and at the same time, the turn-on signal of high voltage level is input to the first gate line of the i-th gate line set, and the second thin film transistor is turned off and the first thin film transistor is turned on, and, the number of the i-th is an integer.

As described above, in some embodiments, the gate driver disposed on two sides of the display panel, that is, the display panel drives both sides of the display panel through the gate driver, meanwhile, because the driving signal is slowly released at a middle section of the second gate line. Therefore, the source of the first thin film transistor can be connected to the middle section of the second gate line, so as to speed up the release of the driving signal in the middle section of the second gate line. Also in other embodiments, the gate driver disposed on only one side of the display pane, that is, only one side of the display panel is driven by the gate driver, meanwhile, the drive signal on the second gate lines far away from the gate driver side is released slower, therefore, the sources of the first thin film transistors may be connected to the second gate lines far away from the gate driver side, so as to speed up the release of the driving signal on the second gate lines far away from the gate driver side.

As described above, in particular, each of the second gate lines corresponds to one of the first gate lines, and the number of the first thin film transistors connecting the first gate lines and the number of the second thin film transistors connecting the corresponding second gate lines between the ratio of 1/5 to 1/10. In addition, the first thin film transistor is used to provide a release driving signal only to a region for releasing the second gate lines which has a slower driving signal, thereby accelerate speed of turning off the second thin film transistors corresponding to the region of the second gate lines. As a result, the production cost of the display panel is reduced while ensuring the driving signal is released.

Figure 3:
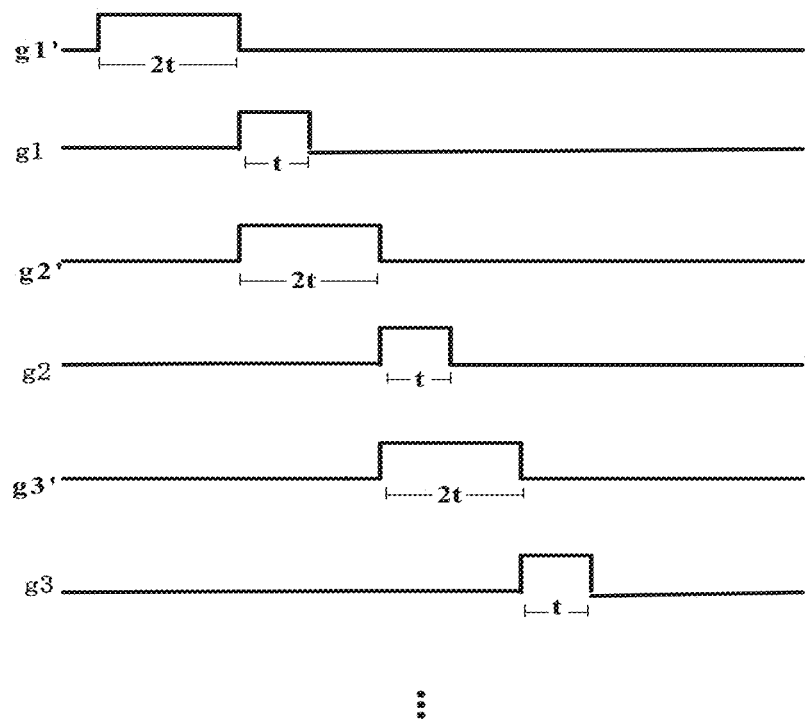
FIG. 3 is a schematic view of a timing of a display panel according to a preferred embodiment of the present invention.
Figure 4:
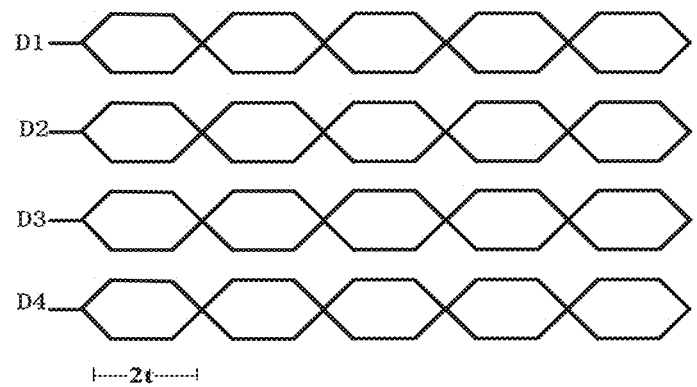
FIG. 4 is another schematic view of a timing of a display panel according to a preferred embodiment of the present invention.

More specifically, according to the above structure, the duration of the first gate line for transmitting the first scan signal is T1, and the duration of the second gate line for transmitting the second scan signal is T2, and the duration of both phases is T2=2T1. As shown in FIG. 2 to FIG. 3, in particular, the duration of the second gate lines g1' to gn' for transmitting the second scan signal is 2t, the duration of the first gate lines g1 to gn for transmitting the first scan signal is t. As shown in FIG. 4, in particular, the duration of the data signal from the data line D1 to the data line Dh is 2t, that is, the duration of the data signal of the data line is same as the duration of the second scan signal.

As described above, in particular, the display panel is driven by the gate driver. At this point, first, enter a high voltage level second scan signal to the second gate line g1', which further connected to the second thin film transistor T2, and then the data signal is applied to the corresponding pixel electrode through the data lines D1-Dh, so that the pixel electrode and the second common electrode on the color filter substrate forming an electric field. During this process, no signal is input into the first gate line g1, and the first thin film transistor T1 is in the off state. After the foregoing process continues for 2t, the second gate line g1' stops transmitting the second scan signal. And at the same time, may enter a high voltage level second scan signal to the first gate line g1, which further connected to the first thin film transistor T1, and then the second scan signal remaining on the second gate line g1' can be quickly released. After the foregoing process continues for t, the second scan signal can be completely discharged, that is, to stop transmission of the first scan signal to the first gate line g1.

Figure 5:
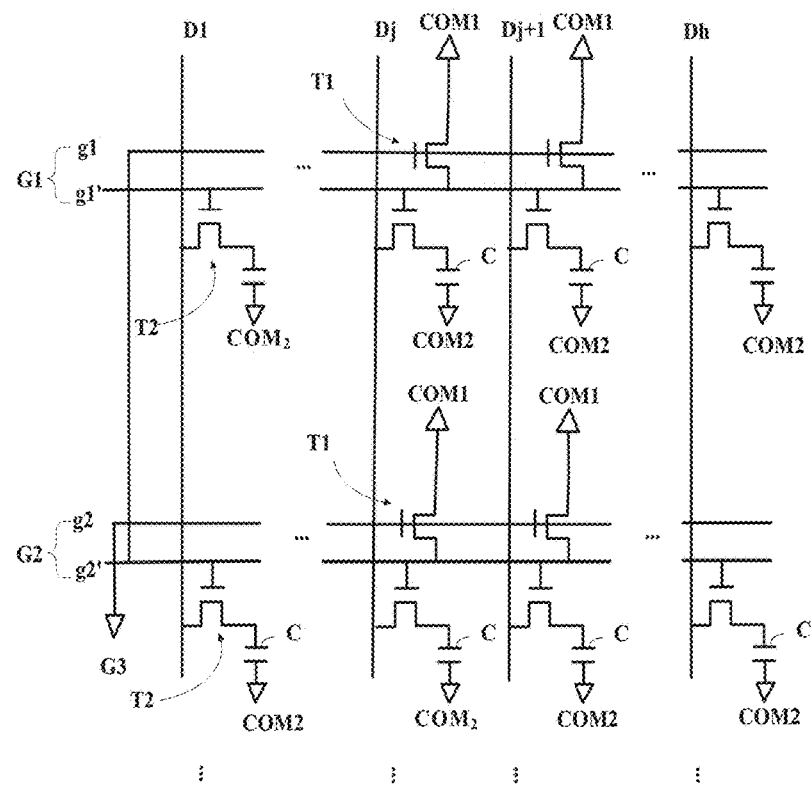
FIG. 5 is another schematic view of a structure of a display panel according to a preferred embodiment of the present invention.
Figure 5:
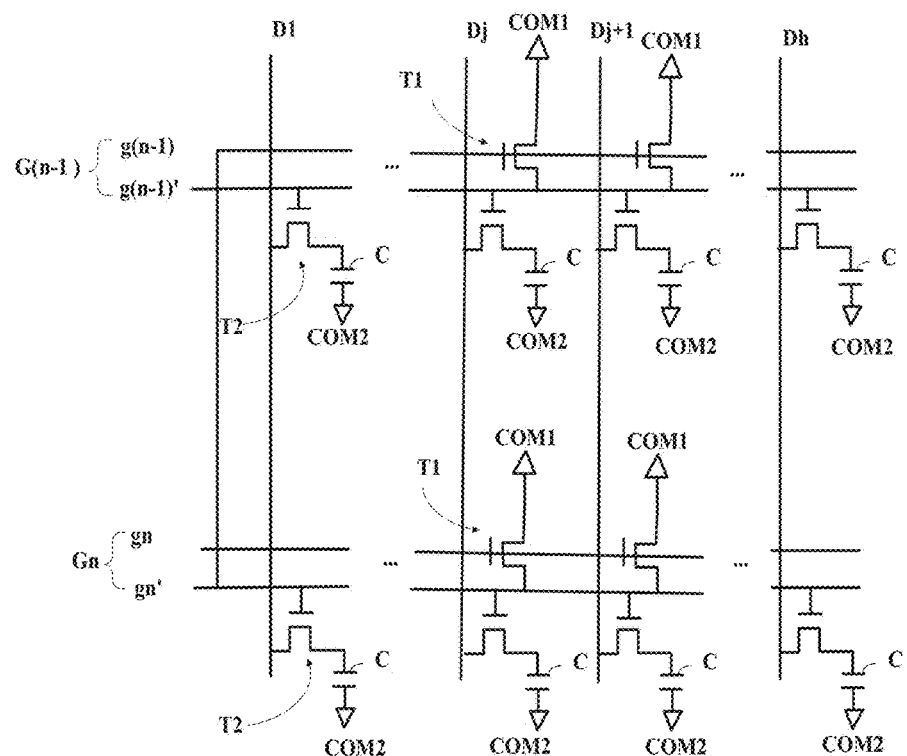
Figure 6:
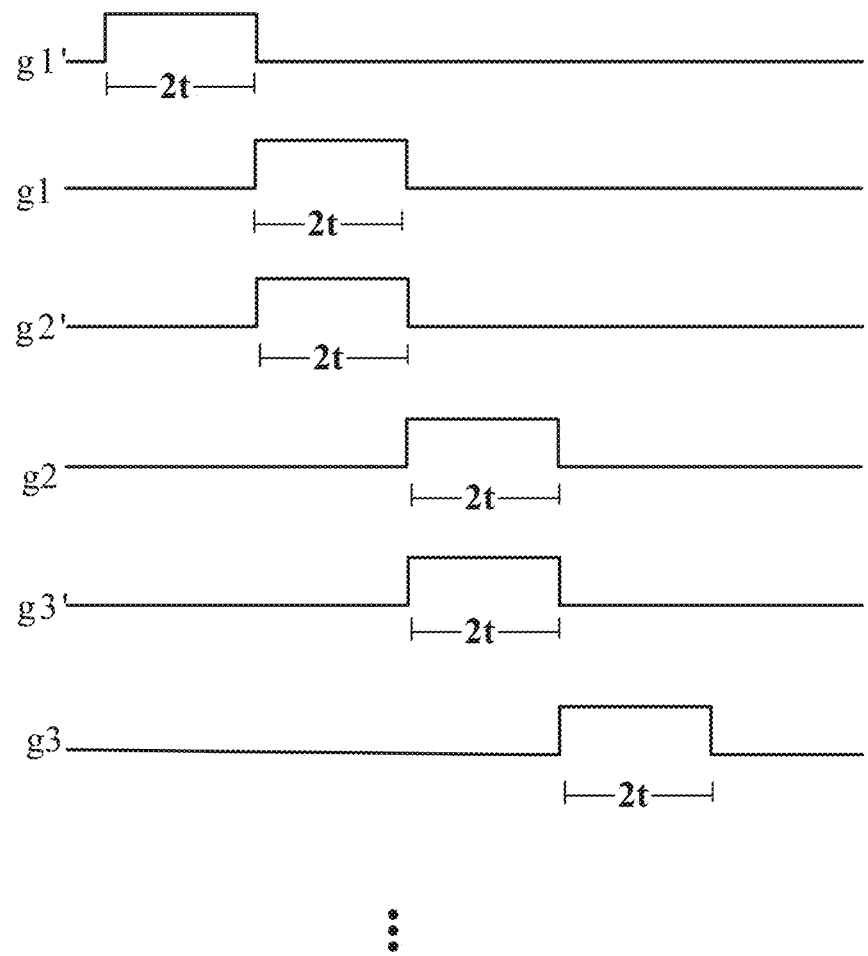
FIG. 6 is another schematic view of a timing of a display panel according to a preferred embodiment of the present invention.

As described above, in some embodiments, the display panel includes "n" gate line sets, and a first gate line gm of an m-th gate line set connected to the second gate line of an (m+1)th gate line set, and the number of n and m is a positive integer, the n is greater than or equal to 2 and the m+1 is less than or equal to n. As shown in FIG. 5, in particular, the first gate line g1 in the first set of gate line sets G1 connected to the second gate line g2' in the second set of gate line sets G2, the first gate line g2 in the second set of gate line sets G2 connected to the second gate line g3' in the third set of gate line sets G3, and the first gate line g (n−1) in the (n−1) set gate line sets connected to the second gate line gn' in the n set of gate line set Gn. At this point, as shown in FIG. 6, in particular, the first gate line g1 in the first set of gate line sets G1 and the second gate line g2' in the second set of gate line sets G2 have same driving timing, and the first gate line g2 in the first set of gate line sets G1 and the second gate line g3' in the second set of gate line sets G2 have same driving timing. In other words, the first gate line in one gate set and the second gate line in the next gate set are controlled by the same driving signal, and in front of the control actions all have same timing.

Figure 7:
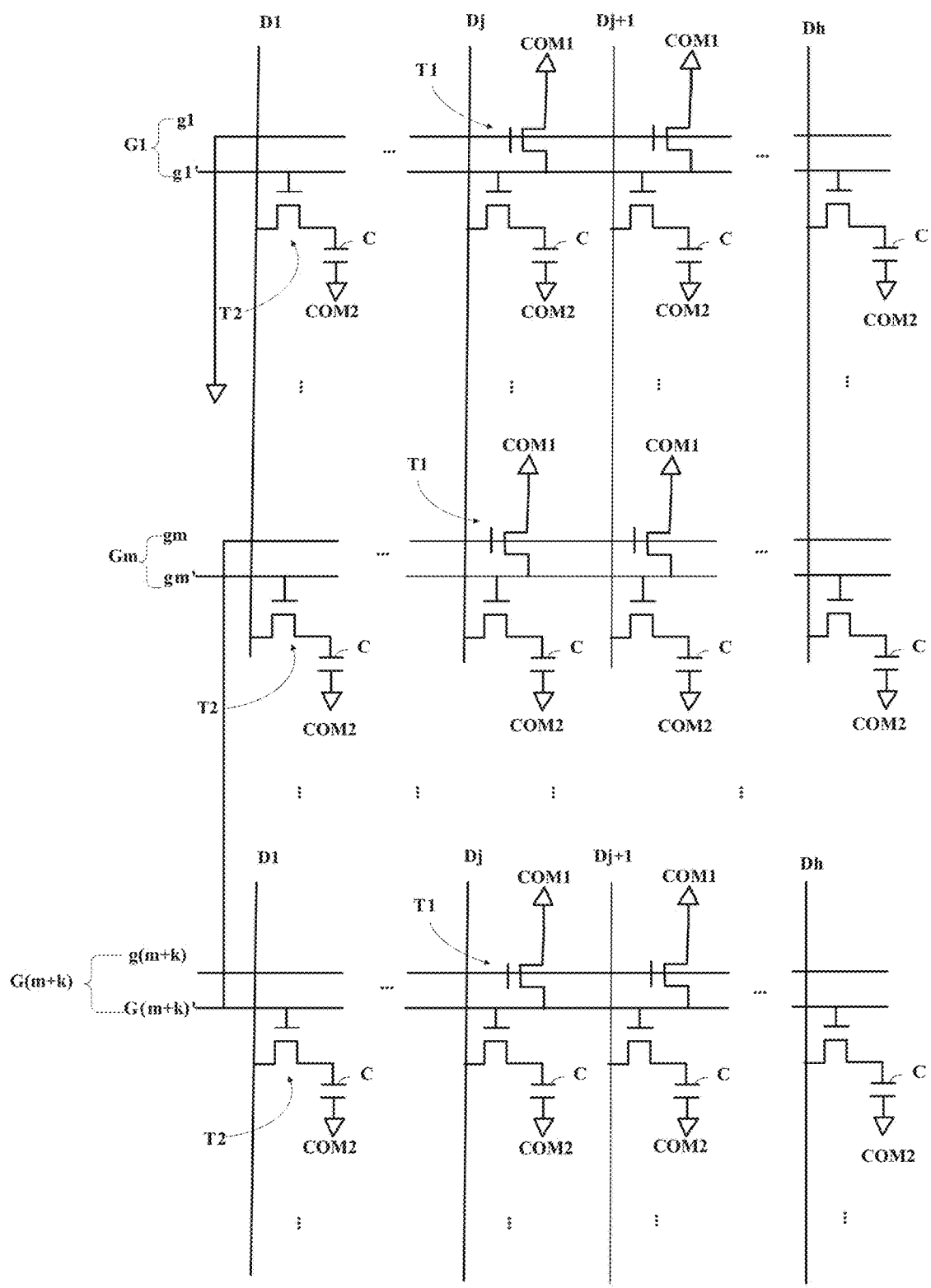
FIG. 7 is another schematic view of a structure of a display panel according to a preferred embodiment of the present invention.

As described above, in some embodiments, as shown in FIG. 7, the display panel includes "n" gate line sets, and the first gate line gm of an m-th gate line set Gm connected to the second gate line g(m+k)' of an (m+k)th gate line set G(m+k), and the number of n, m and k is a positive integer, the n is greater than or equal to 3, the k is greater than or equal to 2 and the m+k is less than or equal to n.

More specifically, according to the above structure, because the n-th gate line set is already a last gate line set, thus, the n-th gate line set is not dispose the second gate line any more. Alternatively, the n-th gate line set configured to have only one second gate line for driving.

The present invention provides a display panel and a display device, by the plurality of first thin film transistors and the plurality of first gate lines are configured, so as to assist the display panel to perform charging and signal releasing operations. Therefore, the display panel and the display device of the present invention can improve the display performance of the display panel.

It should be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A display panel, comprising: an array substrate and a color film substrate, wherein the array substrate is provided with a plurality of data lines, a plurality of gate line sets arranged in parallel to each other, a plurality of first thin film transistors, a plurality of second thin film transistors, a pixel electrode and a first common electrode, a second common electrode disposed on the color filter substrate, wherein the pixel electrode and the second common electrode form a liquid crystal capacitor;

each set of the gate line sets comprises a first gate line and a second gate line, wherein the first gate line and the second gate line are arranged in parallel to each other;

the second thin film transistors are disposed at intersecting points of the second gate lines and the data lines;

a gate electrode of each of the second thin film transistors are connected to the second gate line correspondingly, a source electrode of each of the second thin film transistors are connected to the data line correspondingly, and a drain electrode of each of the second thin film transistors are connected to the pixel electrode;

a gate electrode of each of the first thin film transistors are connected to the first gate line correspondingly, a source electrode of each of the first thin film transistors are connected to the second gate line correspondingly, and the first common electrode is connected to the drain electrode of each of the first thin film transistors; and the first thin film transistor is used to accelerate speed of turning off the second thin film transistor.

2. The display panel according to claim 1, wherein the display panel further comprises a gate driver, the gate is driver is disposed on two sides of the display panel, wherein the source of the first thin film transistor is connected to a middle section of the second gate line.

3. The display panel according to claim 1, wherein the display panel further comprises a gate driver, the gate driver is disposed only on one side of the display panel, and the source of the first thin film transistor is connected to a position of the second gate line away from a side of the gate driver.

4. The display panel according to claim 2, wherein each of the second gate lines corresponds to one of the first gate lines, and the number of the first thin film transistors connecting the first gate lines and the number of the second thin film transistors connecting the corresponding second gate lines between the ratio of 1/5 to 1/10.

5. The display panel according to claim 3, wherein each of the second gate lines corresponds to one of the first gate lines, and the number of the first thin film transistors connecting the first gate lines and the number of the second thin film transistors connecting the corresponding second gate lines between the ratio of 1/5 to 1/10.

6. The display panel according to claim 1, wherein the second gate line of an i-th gate line set inputs a turn-on signal of high voltage level, and at the same time, a signal is not input to the first gate line of the i-th gate line set, and the second thin film transistor is turned on, and the first thin film transistor is turned off, When the second gate line of the i-th gate line set inputs a turn-off signal of low voltage level, and at the same time, the turn-on signal of high voltage level is input to the first gate line of the i-th gate line set, and the second thin film transistor is turned off and the first thin film transistor is turned on, and, the number of the i-th is an integer.

7. The display panel according to claim 1, wherein the first common electrode voltage is less than or equal to the voltage of the first thin film transistor is turned off.

8. The display panel according to claim 1, wherein the display panel comprises "n" gate line sets, and the first gate line of an m-th gate line set connected to the second gate line of an (m+1)th gate line set, and the number of n and m is a positive integer, the n is greater than or equal to 2 and the m+1 is less than or equal to n.

9. The display panel according to claim 8, wherein the display panel comprises "n" gate line sets, and the first gate line of an m-th gate line set connected to the second gate line of an (m+k)th gate line set, and the number of n, m and k is a positive integer, the n is greater than or equal to 3, the k is greater than or equal to 2 and the m+k is less than or equal to n.

10. The display panel according to claim 8, wherein the n-th gate line set is not provided with the second gate line, or the second gate line of the n-th gate line set is driven separately.

11. A display device, comprising: a display panel includes an array substrate and a color film substrate, wherein the array substrate is provided with a plurality of data lines, a plurality of gate line sets arranged in parallel to each other, a plurality of first thin film transistors, a plurality of second thin film transistors, a pixel electrode and a first common electrode, a second common electrode disposed on the color filter substrate, wherein the pixel electrode and the second common electrode form a liquid crystal capacitor;

each set of the gate line sets are comprises a first gate line and a second gate line, wherein the first gate line and the second gate line are arranged in parallel to each other;

the second thin film transistors are disposed at intersecting points of the second gate lines and the data lines;

a gate electrode of each of the second thin film transistors are connected to the second gate line correspondingly, a source electrode of each of the second thin film transistors are connected to the data line correspondingly, and a drain electrode of each of the second thin film transistors are connected to the pixel electrode;

a gate electrode of each of the first thin film transistors are connected to the first gate line correspondingly, a source electrode of each of the first thin film transistors are connected to the second gate line correspondingly, and the first common electrode is connected to the drain electrode of each of the first thin film transistors; and the first thin film transistor is used to accelerate speed of turning off the second thin film transistor.

12. The display device according to claim 11, wherein the display panel further comprises a gate driver, the gate driver is disposed on two sides of the display panel, wherein the sources of the first thin film transistor is connected to a middle section of the second gate line.

13. The display device according to claim 11, wherein the display panel further comprises a gate driver, the gate driver is disposed only on one side of the display pane, and the source of the first thin film transistor is connected to a position of the second gate line away from a side of the gate driver.

14. The display device according to claim 12, wherein each of the second gate lines corresponds to one of the first gate lines, and the number of the first thin film transistors connecting the first gate lines and the number of the second thin film transistors connecting the corresponding second gate lines between the ratio of 1/5 to 1/10.

15. The display device according to claim 13, wherein each of the second gate lines corresponds to one of the first gate lines, and the number of the first thin film transistors connecting the first gate lines and the number of the second thin film transistors connecting the corresponding second gate lines between the ratio of 1/5 to 1/10.

16. The display device according to claim 11, wherein the second gate line of an i-th gate line set inputs a turn-on signal of high voltage level, and at the same time, a signal is not input to the first gate line of the i-th gate line set, and the second thin film transistor is turned on, and the first thin film transistor is turned off, When the second gate line of the i-th gate line set inputs a turn-off signal of low voltage level, and at the same time, the turn-on signal of high voltage level is input to the first gate line of the i-th gate line set, and the second thin film transistor is turned off and the first thin film transistor is turned on, and, the number of the i-th is an integer.

17. The display device according to claim 11, wherein the first common electrode voltage is less than or equal to the voltage of the first thin film transistor is turned off.

18. The display device according to claim 11, wherein the display panel comprises "n" gate line sets, and the first gate line of an m-th gate line set connected to the second gate line of an (m+1)th gate line set, and the number of n and m is a positive integer, the n is greater than or equal to 2 and the m+1 is less than or equal to n.

19. The display device according to claim 18, wherein the display panel comprises "n" gate line sets, and the first gate line of an m-th gate line set connected to the second gate line of an (m+k)th gate line set, and the number of n, m and k is a positive integer, the n is greater than or equal to 3, the k is greater than or equal to 2 and the m+k is less than or equal to n.

20. The display device according to claim 18, wherein the n-th gate line set is not provided with the second gate line, or the second gate line of the n-th gate line set is driven separately.

* * * * *